(12) United States Patent
Baselmans et al.

(10) Patent No.: US 7,248,334 B2
(45) Date of Patent: Jul. 24, 2007

(54) SENSOR SHIELD

(75) Inventors: Johannes Jacobus Matheus Baselmans, Oirschot (NL); Sjoerd Nicolaas Lambertus Donders, 's-Hertogenbosch (NL); Christiaan Alexander Hoogendam, Veldhoven (NL); Hans Jansen, Eindhoven (NL); Jeroen Johannes Sophia Maria Mertens, Duizel (NL); Johannes Catharinus Hubertus Mulkens, Waalre (NL); Bob Streefkerk, Tilburg (NL)

(73) Assignee: ASML Netherlands B.V., Veldhoven (NL)

( * ) Notice: Subject to any disclaimer, the term of this patent is extended or adjusted under 35 U.S.C. 154(b) by 108 days.

(21) Appl. No.: 11/005,500

(22) Filed: Dec. 7, 2004

(65) Prior Publication Data

US 2006/0119816 A1    Jun. 8, 2006

(51) Int. Cl.
 *G03B 27/42* (2006.01)
 *G03B 27/52* (2006.01)
 *G03B 27/58* (2006.01)
 *G03B 27/32* (2006.01)

(52) U.S. Cl. .......................... 355/53; 355/30; 355/72; 355/77

(58) Field of Classification Search ................. 355/30, 355/53, 72, 77; 430/322
See application file for complete search history.

(56) References Cited

U.S. PATENT DOCUMENTS

| | | | |
|---|---|---|---|
| 3,573,975 A | 4/1971 | Dhaka et al. | 117/212 |
| 3,648,587 A | 3/1972 | Stevens | 95/44 |
| 4,346,164 A | 8/1982 | Tabarelli et al. | 430/311 |
| 4,390,273 A | 6/1983 | Loebach et al. | 355/125 |
| 4,396,705 A | 8/1983 | Akeyama et al. | 430/326 |
| 4,480,910 A | 11/1984 | Takanashi et al. | 355/30 |
| 4,509,852 A | 4/1985 | Tabarelli et al. | 355/30 |
| 5,040,020 A | 8/1991 | Rauschenbach et al. | 355/53 |
| 5,121,256 A | 6/1992 | Corle et al. | 359/664 |

(Continued)

FOREIGN PATENT DOCUMENTS

DE     206 607     2/1984

(Continued)

OTHER PUBLICATIONS

English Translation of Japanese Publication 11-176727 cited in Application's PTO-1449.*

(Continued)

*Primary Examiner*—Alan Mathews
(74) *Attorney, Agent, or Firm*—Pillsbury Winthrop Shaw Pittman LLP

(57) ABSTRACT

The lithographic apparatus includes a support structure configured to hold a patterning device. The patterning device is configured to pattern a beam of radiation according to a desired pattern. The lithographic apparatus further includes a substrate table configured to hold a substrate, a projection system configured to project the patterned beam onto a target portion of the substrate, a measurement system configured to measure a parameter of (a) the substrate table, or (b) the substrate, or (c) an image projected by the projection system, or (d) any combination of (a)-(c), and a liquid supply system configured to supply a liquid to a space between the substrate and the projection system. The lithographic apparatus also includes a shield disposed in a vicinity of a portion of the measurement system and configured to shield the portion of the measurement system from the liquid.

30 Claims, 7 Drawing Sheets

U.S. PATENT DOCUMENTS

| | | | |
|---|---|---|---|
| 5,610,683 A | 3/1997 | Takahashi | 355/53 |
| 5,715,039 A | 2/1998 | Fukuda et al. | 355/53 |
| 5,825,043 A | 10/1998 | Suwa | 250/548 |
| 5,900,354 A | 5/1999 | Batchelder | 430/395 |
| 5,978,068 A * | 11/1999 | Park | 355/53 |
| 6,191,429 B1 | 2/2001 | Suwa | 250/548 |
| 6,236,634 B1 | 5/2001 | Lee et al. | 369/112 |
| 6,560,032 B2 | 5/2003 | Hatano | 359/656 |
| 6,600,547 B2 | 7/2003 | Watson et al. | |
| 6,603,130 B1 | 8/2003 | Bisschops et al. | 250/492.1 |
| 6,633,365 B2 | 10/2003 | Suenaga | 355/53 |
| 7,038,760 B2 * | 5/2006 | Mulkens et al. | 355/30 |
| 2002/0020821 A1 | 2/2002 | Van Santen et al. | 250/492 |
| 2002/0163629 A1 | 11/2002 | Switkes et al. | 355/53 |
| 2003/0123040 A1 | 7/2003 | Almogy | 355/69 |
| 2003/0174408 A1 | 9/2003 | Rostalski et al. | 359/642 |
| 2004/0000627 A1 | 1/2004 | Schuster | |
| 2004/0021844 A1 | 2/2004 | Suenaga | |
| 2004/0075895 A1 | 4/2004 | Lin | 359/380 |
| 2004/0109237 A1 | 6/2004 | Epple et al. | |
| 2004/0114117 A1 | 6/2004 | Bleeker | |
| 2004/0119954 A1 | 6/2004 | Kawashima et al. | 355/30 |
| 2004/0125351 A1 | 7/2004 | Krautschik et al. | 355/53 |
| 2004/0135099 A1 | 7/2004 | Simon et al. | |
| 2004/0136494 A1 | 7/2004 | Lof et al. | |
| 2004/0160582 A1 | 8/2004 | De Smit et al. | |
| 2004/0165159 A1 | 8/2004 | Lof et al. | |
| 2004/0207824 A1 | 10/2004 | Lof et al. | |
| 2004/0211920 A1 | 10/2004 | Derksen et al. | |
| 2004/0227923 A1 * | 11/2004 | Flagello et al. | 355/71 |

FOREIGN PATENT DOCUMENTS

| | | |
|---|---|---|
| DE | 221 563 | 4/1985 |
| DE | 224448 | 7/1985 |
| DE | 242880 | 2/1987 |
| EP | 0023231 | 2/1981 |
| EP | 0418427 | 3/1991 |
| EP | 1039511 | 9/2000 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| WO | WO 99/49504 | 9/1999 |
| WO | WO 03/077036 | 9/2003 |
| WO | WO 03/077037 | 9/2003 |
| WO | WO 2004/019128 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |

OTHER PUBLICATIONS

English Translation of Japanese Publication 11-176727 (date of publication—Jul. 1999) cited in Applicant's PTO-1449.*

Flagello et al., U.S. Appl. No. 10/698,012, filed Oct. 31, 2003.

Van Santen et al., U.S. Appl. No. 10/743,271, filed Dec. 23, 2003.

Mulkens et al., U.S. Appl. No. 10/743,266, filed Dec. 23, 2003.

Streefkerk et al., U.S. Appl. No. 10/719,683, filed Nov. 24, 2003.

Suwa et al., U.S. Appl. No. 10/367,910, filed Feb. 19, 2003.

M. Switkes et al., "Immersion Lithography at 157 nm", MIT Lincoln Lab, Orlando 2001-1, Dec. 17, 2001.

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challanges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths To Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future Fab International, vol. 15, Jul. 11, 2003.

H. Kawata et al., "Fabrication of 0.2μm Fine Patterns Using Optical Projection Lithography with an Oil Immersion Lens", Jpn. J. Appl. Phys. vol. 31 (1992), pp. 4174-4177.

G. Owen et al., "1/8μm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $k_3$ coefficient in nonparaxial λ/NA scaling equations for resolution, depth of focus, and immersion lithography, *J. Microlith., Microfab., Microsyst.* 1(1):7-12 (2002).

* cited by examiner

SENSOR SHIELD

FIELD

The present invention relates to a lithographic apparatus and in particular to an immersion lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein.

However, submersing the substrate or substrate and substrate table in a bath of liquid (see for example U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate (the substrate generally has a larger surface area than the final element of the projection system). One way which has been proposed to arrange for this is disclosed in PCT patent application no. WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

SUMMARY

According to an aspect of the present invention, there is provided a lithographic apparatus. The lithographic apparatus includes a support structure configured to hold a patterning device. The patterning device is configured to pattern a beam of radiation according to a desired pattern. The lithographic apparatus further includes a substrate table configured to hold a substrate, a projection system configured to project the patterned beam onto a target portion of the substrate, a measurement system configured to measure a parameter of (a) the substrate table, or (b) the substrate, or (c) an image projected by the projection system, or (d) any combination of (a)-(c), and a liquid supply system configured to supply a liquid to a space between the substrate and the projection system. The lithographic apparatus also includes a shield disposed in a vicinity of a portion of the measurement system and configured to shield the portion of the measurement system from the liquid.

In an embodiment of the invention, the measurement system includes a sensor. The sensor includes, for example, an alignment sensor, a level sensor, a transmission image sensor, a lens interferometer, or any combination of the foregoing. In an embodiment of the invention, a portion of the sensor includes a reference mark provided on the substrate table.

In an embodiment of the invention, the shield includes a plate disposed on the portion of the measurement system. A robot arm may be provided in the lithographic apparatus and configured to position the plate on the portion of the measurement system and to remove the plate from the portion of the measurement system. The plate can be configured to keep the projection system in contact with liquid when the substrate table is moved from under the projection system. A release mechanism can be provided to lift or hold the plate so as to keep the projection system in contact with liquid.

In an embodiment of the invention, the shield includes a shutter actionable to isolate the portion of the measurement system from the liquid. In an embodiment of the invention, the shutter includes a plate configured to open and close an opening of a cavity in the substrate table in which the portion of the measurement system is provided. In an embodiment of the invention, the shutter includes a sector or compound shutter configured to open and close an opening of a cavity in the substrate table in which the portion of the measurement system is provided.

In an embodiment of the invention, the shield includes a gas inlet provided in a vicinity of the portion of the measurement system and configured to generate a gas jet to remove substantially all liquid on or near the portion of the measurement system. In an embodiment of the invention, the shield comprises a vacuum outlet provided in a vicinity of the portion of the measurement system and configured to draw away substantially all liquid on or near the portion of the measurement system.

Another aspect of the invention is to provide a method for manufacturing a device, the method including projecting a patterned beam of radiation using a projection system through a liquid between the projection system and a substrate onto a target portion of the substrate; and shielding a portion of a measurement system, configured to measure a parameter of (a) a substrate table, or (b) the substrate, or (c) an image projected by the projection system, or (d) any combination of (a)-(c), from the liquid.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
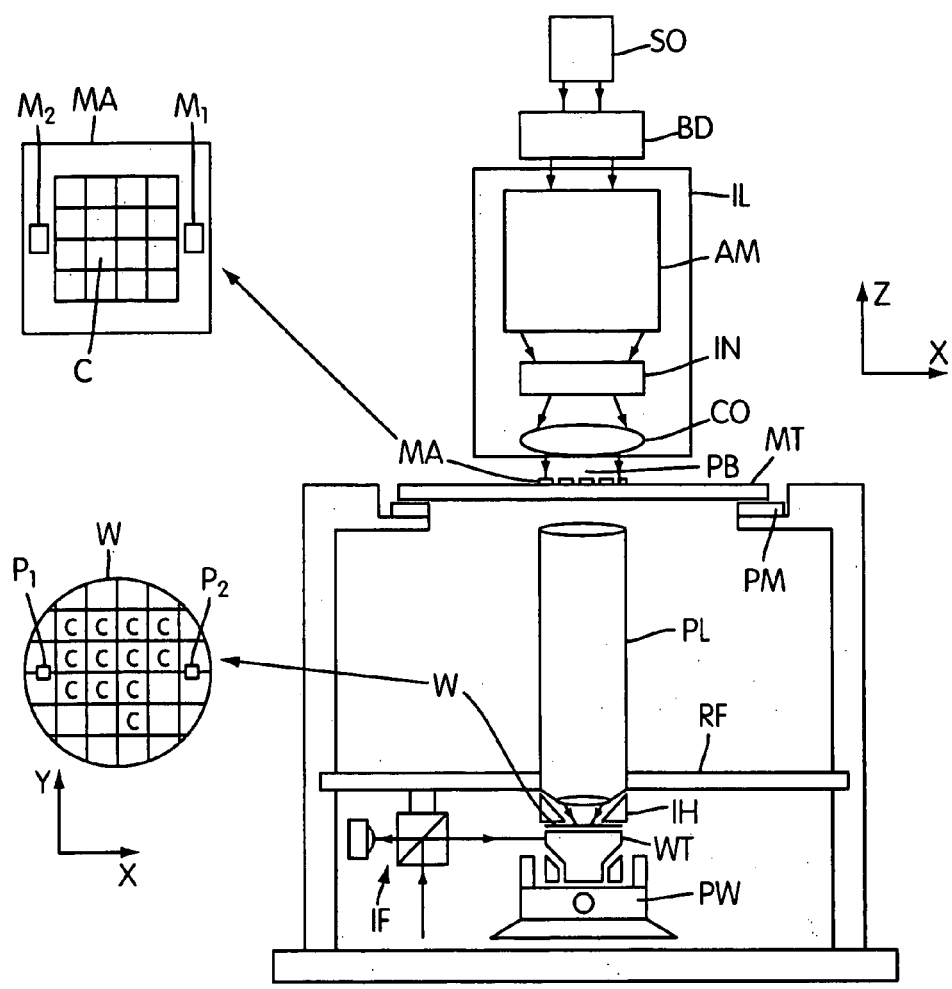
FIG. 1 depicts a lithographic apparatus according to an embodiment of the invention.
Figure 2:
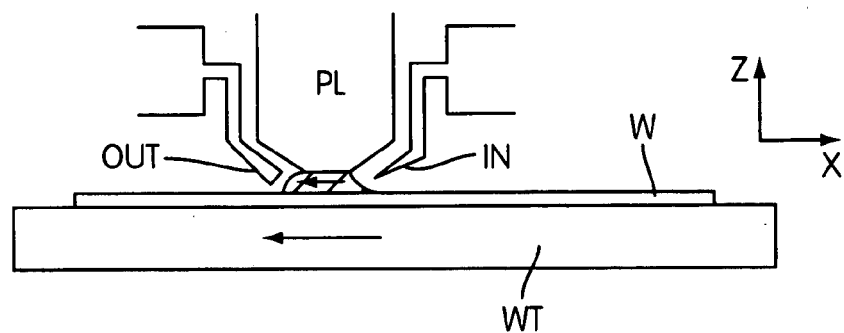
FIGS. 2 and 3 depict a liquid supply system for use in a lithographic projection apparatus.
Figure 3:
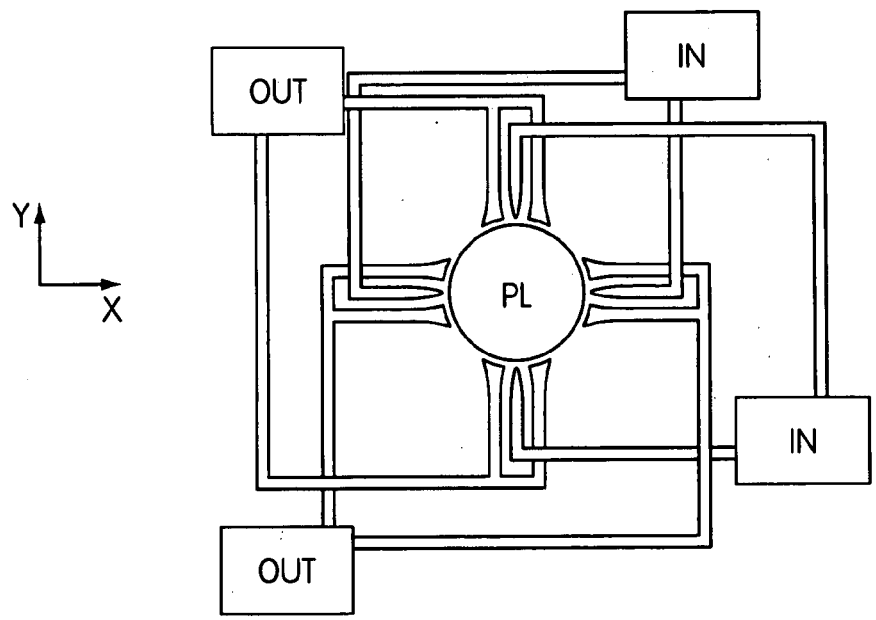

FIG. 1 schematically depicts a lithographic apparatus according to one embodiment of the invention. The apparatus comprises:

an illumination system (illuminator) IL configured to condition a radiation beam PB (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam PB by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam PB is incident on the patterning device (e.g., mask MA), which is held on the support structure (e.g., mask table MT), and is patterned by the patterning device. Having traversed the mask MA, the radiation beam PB passes through the projection system PL, which focuses the beam onto a target portion C of the substrate W. An immersion hood IH, which is described further below, supplies immersion liquid to a space between the final element of the projection system PL and the substrate W.

With the aid of the second positioner PW and position sensor IF (e.g. an interferometric device, linear encoder or capacitive sensor), the substrate table WT can be moved accurately, e.g. so as to position different target portions C in the path of the radiation beam PB. Similarly, the first positioner PM and another position sensor (which is not explicitly depicted in FIG. 1) can be used to accurately position the mask MA with respect to the path of the radiation beam PB, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks).

Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 4:
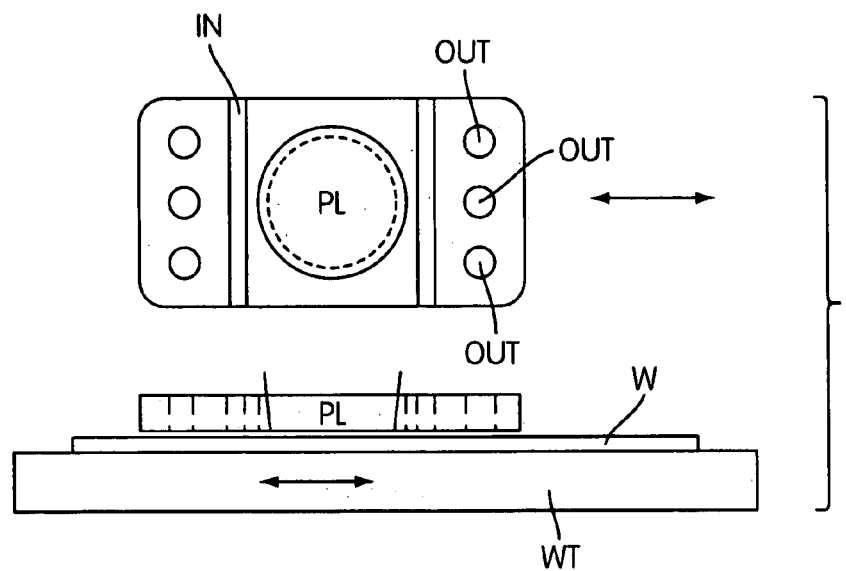
FIG. 4 depicts another liquid supply system for use in a lithographic projection apparatus.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Figure 5:
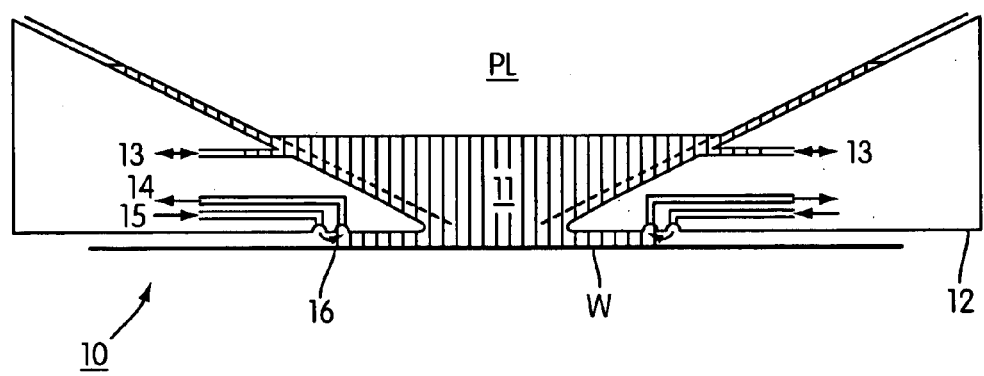
FIG. 5 depicts another liquid supply system for use in a lithographic projection apparatus.

Another immersion lithography solution with a localized liquid supply system solution which has been proposed is to provide the liquid supply system with a seal member which extends along at least a part of a boundary of the space between the final element of the projection system and the substrate table. Such a solution is illustrated in FIG. 5. The seal member is substantially stationary relative to the projection system in the XY plane though there may be some relative movement in the Z direction (in the direction of the optical axis). A seal is formed between the seal member and the surface of the substrate.

Referring to FIG. 5, reservoir 11 forms a contactless seal to the substrate around the image field of the projection system so that liquid is confined to fill a space between the substrate surface and the final element of the projection system. The reservoir is formed by a seal member 12 positioned below and surrounding the final element of the projection system PL. Liquid is brought into the space below the projection system and within the seal member 12. The seal member 12 extends a little above the final element of the projection system and the liquid level rises above the final element so that a buffer of liquid is provided. The seal member 12 has an inner periphery that at the upper end, in an embodiment, closely conforms to the shape of the projection system or the final element thereof and may, e.g., be round. At the bottom, the inner periphery closely conforms to the shape of the image field, e.g., rectangular though this need not be the case.

The immersion liquid is confined in the reservoir by a gas seal 16 between the bottom of the seal member 12 and the surface of the substrate W. The gas seal is formed by gas, e.g. air or synthetic air but, in an embodiment, $N_2$ or an inert gas, provided under pressure via inlet 15 to the gap between seal member 12 and substrate and extracted via first outlet 14. The overpressure on the gas inlet 15, vacuum level on the first outlet 14 and geometry of the gap are arranged so that there is a high-velocity gas flow inwards that confines the liquid. Such a system is disclosed in U.S. patent application Ser. No. 10/705,783, hereby incorporated in its entirety by reference.

Figure 6:
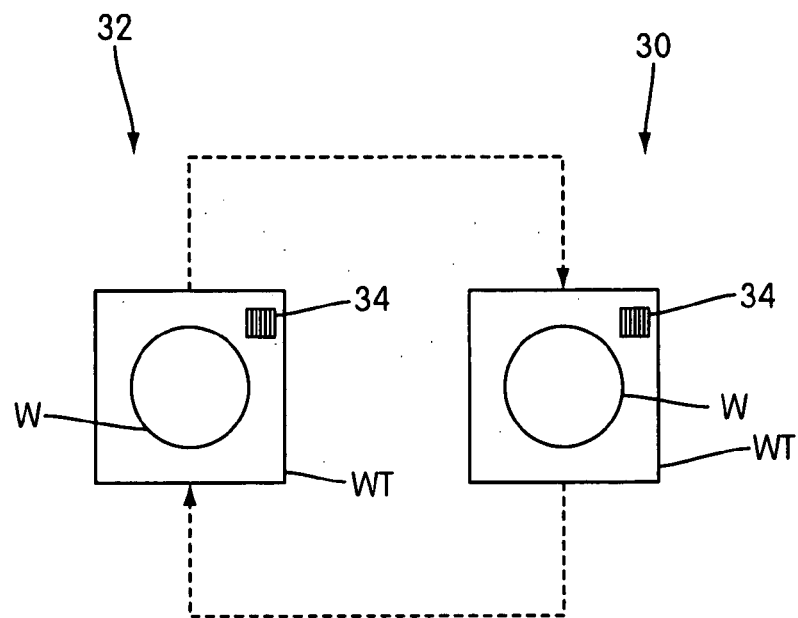
FIG. 6 shows a lithographic apparatus with a dual stage according to an embodiment of the present invention.

The lithographic apparatus may comprise one or more stations at least one of which is an exposure station. For example, FIG. 6 shows a top view of a lithographic apparatus having two stations 30 and 32. In an embodiment and as depicted in FIG. 6, two substrate tables WT are moved or swapped between station 30, which here includes a measurement station, and exposure station 32. The swap of the two substrate tables WT is indicated in FIG. 6 by a dotted line such that the two substrate tables alternately share the exposure station 32 and the station 30. A potential advantage of such an arrangement is a possible increase in throughput, in that one substrate may be exposed while the next substrate to be exposed is being measured. Another possible advantage of such an arrangement in an immersion lithographic apparatus is to perform certain operations in dry conditions while the exposure takes place in wet conditions. For example, leveling or alignment measurements may be advantageously carried out with a table at a first position, without immersion liquid, and exposure is carried out with a table at a second position, where immersion liquid is present. Alternatively, the apparatus may have only one substrate table in which case the measurement station and the exposure station may be at one location or at two locations and the substrate table moves between the stations.

In this particular case, the measurement station 30 is a position of the substrate table WT in the lithographic apparatus at which measurement (such as alignment and/or levelling) operations of the substrate table WT and/or the substrate W take place. One or more measurement systems are used at the measurement station 30 which include, for example, measurement sensors 34 (e.g. an optical encoder, a capacitive sensor, a level sensor, an alignment sensor, etc.). The exposure station 32 is a position in the lithographic apparatus where the exposure of the substrate W to radiation through the projection system takes place. In an embodiment, station 30 may be a prealignment station 30 where the substrate is prealigned, typically inside a substrate handling chamber in the lithographic apparatus, prior to being disposed by a substrate handler robot on the substrate table WT, for example. Generally, the station 30 may be almost any location or locations in the lithographic apparatus, including the substrate handling chamber.

One or more sensors of the measurement system are used in a lithographic apparatus to detect one or more parameters including, for example, the relative height of a surface of a substrate (with a level sensor), the alignment of a substrate or substrate table (with an alignment sensor) or the characteristics of an aerial image projected by the projection system at the substrate level (with a transmission image sensor). It should be appreciated that the measurement system as disclosed and claimed herein need only be capable of measuring a parameter of one item, such as (a) the substrate table, (b) the substrate, or (c) the image projected by the projection system. However, it is contemplated that more than one of (a)-(c) may also be measured. For purposes herein, a sensor can be classified as one of at least two types of sensors. A first type of sensor should or may not be used when wet or in wet conditions as may come from the use of, for example, an immersion liquid in the lithographic apparatus. Sensors of the first type may include, for example, the level sensor and the alignment sensor 34 which are used at a measurement station and which are denominated as "dry sensors". Reasons for this first type of sensor include that the sensor may not be tolerant of a liquid (and not function properly) and/or the sensor may not give accurate or useful results when wet or used in wet conditions.

The term sensor as used herein includes any portion of or used by a sensing system, for example, a reference mark on a surface of the substrate table used by the sensor (as shown in FIG. 6), a sensor component incorporated in the substrate table, or any portion of a sensor element or a radiation source.

Figure 7:
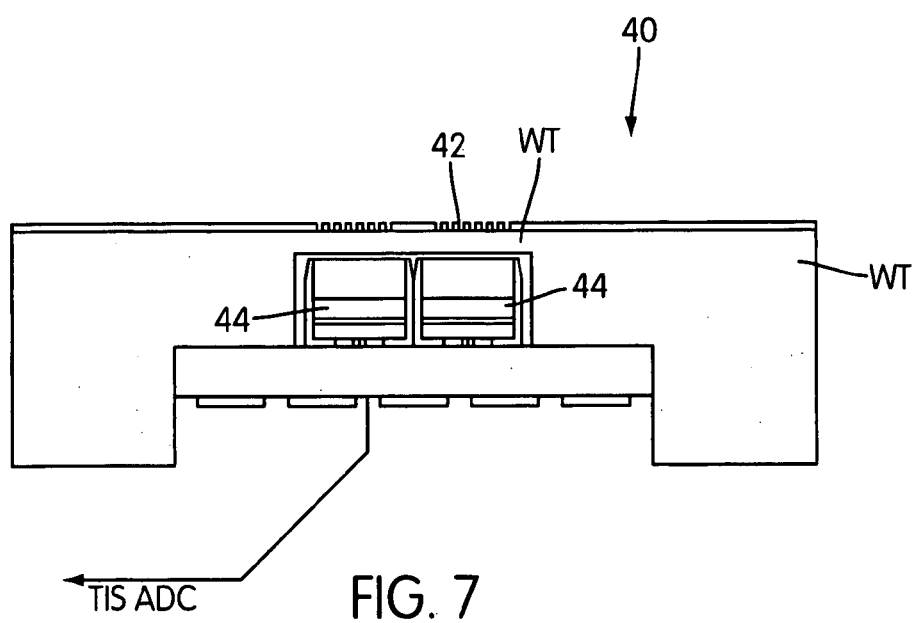
FIG. 7 shows an example of a transmission image sensor that can be used to measure a position of an aerial image at a substrate level.

A second type of sensor may be used when wet or in wet conditions. The second type of sensor may be used at the exposure of the lithographic apparatus where immersion liquid is present and thus are denominated as "wet sensors." Sensors of the second type may include, for example, a Transmission Image Sensor (TIS), a spot sensor and a Lens Interferometer (LI) sensor. A LI sensor is an interferometer in the lithographic apparatus used to measure projection system aberrations (and the measurements may be used to control the wavefront of the radiation). FIG. 7 shows an example of a transmission image sensor (TIS). TIS 40 is a sensor that is used to measure the position at a substrate level of a projected aerial image of a mask pattern. The projected image at substrate level may be a line pattern with a line width comparable to the wavelength of the exposure radiation. The TIS measures the mask pattern using a transmission pattern 42 with a photocell 44 underneath it. The photocell 44 generates an analog electrical signal which is transformed via an analog-to-digital converter ADC into digital data. For example, the sensor data may be used to measure the position of the mask with respect to the substrate table in six degrees of freedom (three in translation and three in rotation). In addition, the magnification and scaling of the projected mask may be measured. The TIS may also be used to measure the optical performance of the lithographic apparatus. Different illumination settings are used in combination with different projected images for measuring properties such as pupil shape, coma, spherical aberration, astigmatism and field curvature.

In an embodiment, both wet and dry sensors may be used in an immersion lithographic apparatus. Where a dry sensor is used in such an apparatus, it may come in contact with a liquid, for example during the operation of providing an immersion liquid to a portion of the substrate. When such a dry sensor becomes wet or is used in wet conditions, the dry sensor may not give accurate, proper or useful results.

For example, even a small liquid residue on a dry sensor using a measurement radiation beam could introduce a reflection and/or refraction which could lead to a wrong reading. A liquid film on a dry sensor, such as a reference mark on the substrate table, may cause, for example, double reflections of a measurement radiation beam within the liquid film. In order to prevent or substantially eliminate contact of the dry sensor with a liquid in the lithographic apparatus, it would be advantageous to dry the dry sensor and/or to shield the dry sensor from the liquid (e.g., immersion liquid).

Figure 8:
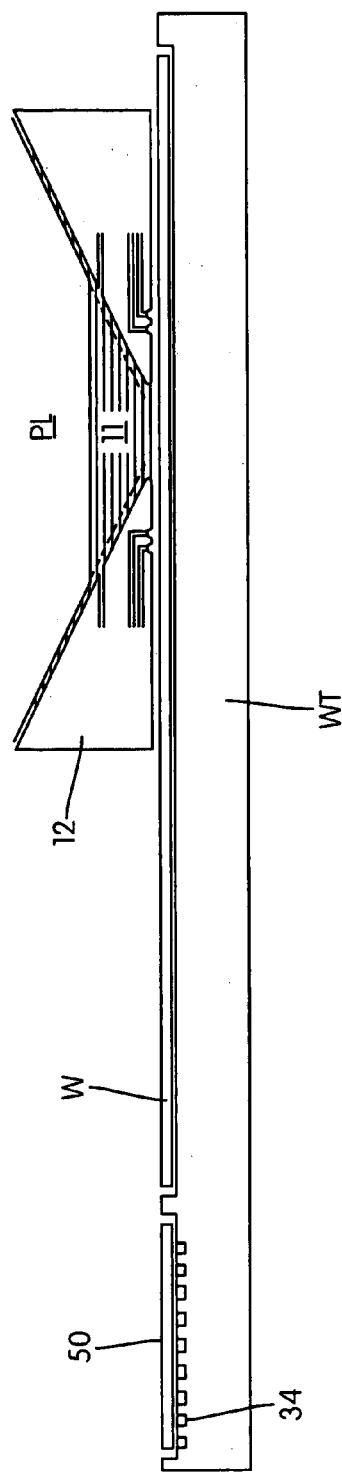
FIG. 8 shows a plate disposed on top of a reference mark, provided on a substrate table, to shield the reference mark from a liquid in the lithographic apparatus in accordance with an embodiment of the present invention.

In an embodiment of the invention, a shield is used to shield a portion of the dry sensor, for example the reference mark 34 on the substrate table, which may get into contact with the liquid. For example, as shown in FIG. 8, a plate 50 may be disposed on top of the reference mark 34 so as to shield the reference mark 34 from contact with liquid, such as the liquid in reservoir 11. For example, the reference mark 34 may be moved, such as during substrate exchange into proximity with the liquid in reservoir 11 and thus may become wet.

The plate 50 may be disposed on the reference mark 34, for example, with the use of a robot arm prior to bringing the substrate table to an area of the lithographic apparatus where liquid is present, such as immersion exposure station 32. The plate 50 can be picked up and removed from the reference mark 34 when measurements (e.g., alignment, leveling, etc.) are performed at the measurement station 30.

Although a plate 50 is illustrated as being used to cover the reference mark 34, it must be appreciated that a shield of any other shape or type may be used to isolate the reference mark 34 from liquid. For example, a box or a hemisphere shape may be used to cover the reference mark 34.

In an embodiment, where a closing plate may be provided in the lithographic apparatus which is used to keep the projection system in contact with liquid when the substrate is table moved away from under the projection system, the closing plate may be used as a shield to protect the reference mark 34 from contact with liquid in reservoir 11.

Specifically, during exposure of the substrate, the closing plate 50 carried by the substrate table WT may be used to cover the reference mark 34. When the exposure is done, the closing plate may be brought underneath the opening of reservoir 11 and a release mechanism may be triggered to lift or hold the closing plate so that the closing plate covers the opening. The release mechanism may take the form of a magnetic release or a vacuum release. For example, the seal member 12 may comprise a magnet to generate the force required to attach the closing plate to the seal member 12. Alternatively, a vacuum outlet may be provided to attract the closing plate 50 to the seal member 12.

Figure 9:
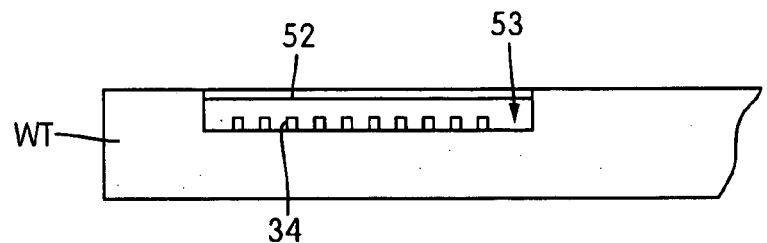
FIG. 9 shows a shutter covering a reference mark on the substrate table in accordance with an embodiment of the present invention.
Figure 10:
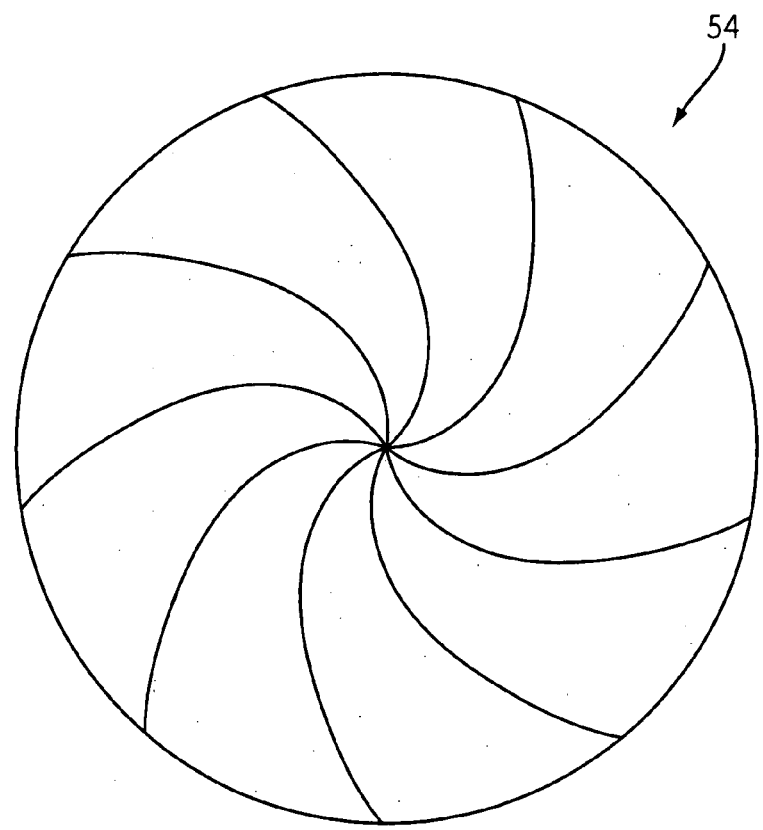
FIG. 10 shows an example of a shutter that can be used to shield a reference mark on a substrate table in accordance with an embodiment of the present invention.

In an embodiment, shown in FIG. 9, in order to shield the reference mark 34, a shutter 52 may be used to cover the reference mark 34. With this arrangement, for example, the shutter 52 may be moved to close or open a cavity 53 in the substrate table WT in which the reference mark 34 is provided. The cavity may be closed by the shutter during exposure of the substrate when liquid is in contact with the substrate W in order to avoid wetting of reference mark 34. The shutter may take the form of, for example, a plate (or blade) that is actionable to open and close the cavity 53 in substrate table WT. The shutter may also take the form of a sector compound shutter 54 to open and close the cavity, as shown in FIG. 10 and found, for example, in cameras.

Figure 11:
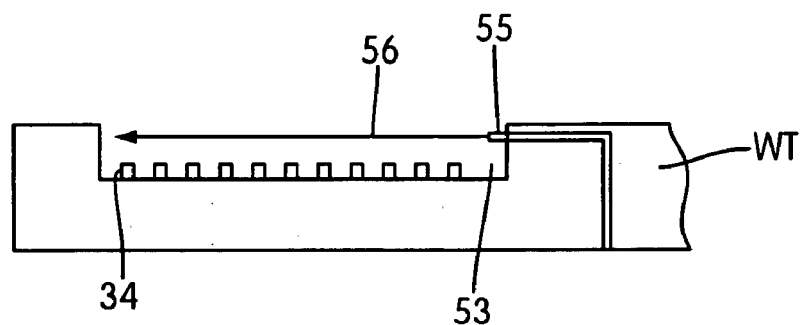
FIG. 11 shows a gas inlet adapted to provide a gas jet to remove any liquid from a reference mark on a substrate table in accordance with an embodiment of the present invention.
Figure 12:
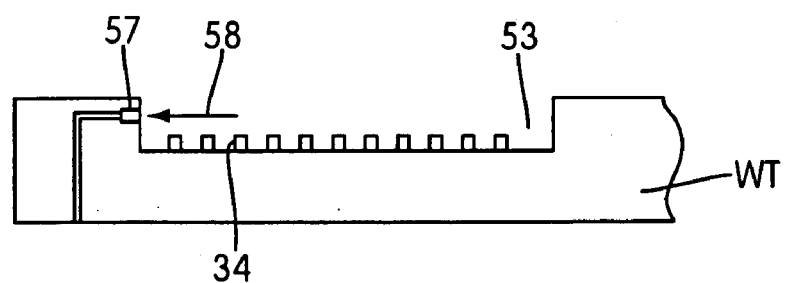
FIG. 12 shows a vacuum system adapted to draw away any liquid from a reference mark on a substrate table in accordance with an embodiment of the present invention.

In an embodiment, shown in FIG. 11, in order to shield the reference mark 34, a gas inlet 55 may be provided in the vicinity of the reference mark 34 and combined to generate a gas jet or gas flow 56 to remove any liquid that may have come into contact with the reference mark 34 or to prevent liquid from coming into contact with the reference mark 34. In an embodiment, shown in FIG. 12, a vacuum system with an outlet 57 arranged in the vicinity of the reference mark may be provided to draw in (as illustrated by the arrow 58) any liquid that may come into contact with the reference mark 34 or t6 prevent liquid from coming into contact with the reference mark 34. In an embodiment, a combination of the above arrangements, in which both a gas inlet and a gas outlet as well may be provided in the vicinity of the reference mark 34 to remove any trace of liquid that may come into contact with the reference mark 34 or to prevent liquid from coming into contact with the reference mark 34.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, where applicable, the invention may take the form of a computer program containing one or more sequences of machine-readable instructions describing a method as disclosed above, or a data storage medium (e.g. semiconductor memory, magnetic or optical disk) having such a computer program stored therein.

The present invention can be applied to any immersion lithography apparatus, in particular, but not exclusively, those types mentioned above. Although an immersion liquid system using a gas seal is described above, it must be appreciated that other types of immersion liquid systems may be used. For example, an immersion liquid system that employs an actuated seal. Furthermore, the immersion liquid used in the apparatus may have different compositions, according to the desired properties and the wavelength of exposure radiation used. For an exposure wavelength of 193 nm, ultra pure water or water-based compositions may be used and for this reason the immersion liquid is sometimes referred to as water and water-related terms such as hydrophilic, hydrophobic, humidity, etc. may be used.

The descriptions above are intended to be illustrative, not limiting. Thus, it will be apparent to one skilled in the art that modifications may be made to the invention as described without departing from the scope of the claims set out below.

We claim:

1. A lithographic apparatus, comprising:
   a support structure configured to hold a patterning device, the patterning device configured to pattern a beam of radiation according to a desired pattern;
   a substrate table configured to hold a substrate;
   a projection system configured to project the patterned beam onto a target portion of the substrate;

a measurement system configured to measure a parameter of (a) the substrate table, or (b) the substrate, or (c) an image projected by the projection system, or (d) any combination of (a)-(c);

a liquid supply system configured to supply a liquid to a space between the substrate and the projection system; and a shield disposed in a vicinity of a portion of the measurement system, the shield or a portion thereof movable between a first position where the shield or portion thereof is configured to shield the portion of the measurement system from the liquid and a second position where the shield or portion thereof is configured to expose the portion of the measurement system to an environment substantially without liquid.

2. The apparatus according to claim 1, wherein the measurement system comprises a sensor.

3. The apparatus according to claim 2, wherein the sensor comprises an alignment sensor, a level sensor, a transmission image sensor, a lens interferometer, or any combination of the foregoing.

4. The apparatus according to claim 2, wherein the portion of the measurement system comprises a reference mark provided on the substrate table.

5. The apparatus according to claim 1, wherein the shield comprises a plate disposed on the portion of the measurement system.

6. The apparatus according to claim 5, further comprising a robot arm configured to position the plate on the portion of the measurement system and to remove the plate from the portion of the measurement system.

7. The apparatus according to claim 5, wherein the plate is configured to keep the projection system in contact with liquid when the substrate table is moved from under the projection system.

8. The apparatus according to claim 7, further comprising a release mechanism configured to lift or hold the plate so as to keep the projection system in contact with liquid.

9. The apparatus according to claim 1, wherein the shield comprises a shutter actionable to isolate the portion of the measurement system from the liquid.

10. The apparatus according to claim 9, wherein the shutter comprises a plate configured to open and close an opening of a cavity in the substrate table in which the portion of the measurement system is provided.

11. The apparatus according to claim 9, wherein the shutter comprises a sector or compound shutter configured to open and close an opening of a cavity in the substrate table in which the portion of the measurement system is provided.

12. The apparatus according to claim 1, wherein the measurement system can measure a parameter of only one of (a), (b), or (c).

13. A lithographic apparatus comprising:

a support structure configured to hold a patterning device, the patterning device configured to pattern a beam of radiation according to a desired pattern;

a substrate table configured to hold a substrate;

a projection system configured to project the patterned beam onto a target portion of the substrate;

a measurement system configured to measure a parameter of (a) the substrate table, or (b) the substrate, or (c) an image projected by the projection system, or (d) any combination of (a)-(c);

a liquid supply system configured to supply a liquid to a space between the substrate and the projection system; and a shield disposed in a vicinity of a portion of the measurement system and configured to shield the portion of the measurement system from the liquid, the shield comprising a gas inlet provided in a vicinity of the portion of the measurement system and configured to generate a gas jet to remove substantially all liquid on or near the portion of the measurement system.

14. The apparatus according to claim 13, wherein the measurement system comprises an alignment sensor, a level sensor, a transmission image sensor, a lens interferometer, or any combination of the foregoing.

15. The apparatus according to claim 13, wherein the portion of the measurement system comprises a reference mark provided on the substrate table.

16. A lithographic apparatus comprising:

a support structure configured to hold a patterning device, the patterning device configured to pattern a beam of radiation according to a desired pattern;

a substrate table configured to hold a substrate;

a projection system configured to project the patterned beam onto a target portion of the substrate;

a measurement system configured to measure a parameter of (a) the substrate table, or (b) the substrate, or (c) an image projected by the projection system, or (d) any combination of (a)-(c);

a liquid supply system configured to supply a liquid to a space between the substrate and the projection system; and a shield disposed in a vicinity of a portion of the measurement system and configured to shield the portion of the measurement system from the liquid, the shield comprising a vacuum outlet provided in a vicinity of the portion of the measurement system and configured to draw away substantially all liquid on or near the portion of the measurement system.

17. The apparatus according to claim 16, wherein the measurement system comprises an alignment sensor, a level sensor, a transmission image sensor, a lens interferometer, or any combination of the foregoing.

18. The apparatus according to claim 16, wherein the portion of the measurement system comprises a reference mark provided on the substrate table.

19. A method for manufacturing a device, comprising:

projecting a patterned beam of radiation using a projection system through a liquid between the projection system and a substrate onto a target portion of the substrate; and moving a shield structure between a first position where the shield structure is configured to shield a portion of a measurement system from the liquid and a second position where the shield structure is configured to open the portion of the measurement system to an ambient gas, the measurement system configured to measure a parameter of (a) a substrate table, or (b) the substrate, or (c) an image projected by the projection system, or (d) any combination of (a)-(c).

20. The method according to claim 19, wherein shielding comprises disposing a plate on the portion of the measurement system.

21. The method according to claim 19, wherein shielding comprises isolating the portion of the measurement system from the liquid by actuating a shutter.

22. The method according to claim 19, wherein shielding comprises closing an opening of a cavity in the substrate table in which the portion of the measurement system is provided.

23. The method according to claim 19, wherein the portion of the measurement system comprises a reference mark provided on the substrate table.

24. The method according to claim 19, wherein the measurement system measures a parameter of only one of (a), (b), or (c).

25. A method for manufacturing a device comprising:
projecting a patterned beam of radiation using a projection system through a liquid between the projection system and a substrate onto a target portion of the substrate; and
shielding a portion of a measurement system, configured to measure a parameter of (a) a substrate table, or (b) the substrate, or (c) an image projected by the projection system, or (d) any combination of (a)-(c), from the liquid, the shielding comprising generating a gas jet to remove substantially all liquid on or near the portion of the measurement system.

26. The method according to claim 25, wherein the measurement system comprises an alignment sensor, a level sensor, a transmission image sensor, a lens interferometer, or any combination of the foregoing.

27. The method according to claim 25, wherein the portion of the measurement system comprises a reference mark provided on a substrate table.

28. A method for manufacturing a device comprising:
projecting a patterned beam of radiation using a projection system through a liquid between the projection system and a substrate onto a target portion of the substrate; and
shielding a portion of a measurement system, configured to measure a parameter of (a) a substrate table, or (b) the substrate, or (c) an image projected by the projection system, or (d) any combination of (a)-(c), from the liquid, the shielding comprising drawing away substantially all liquid on or near the portion of the measurement system.

29. The method according to claim 28, wherein the measurement system comprises an alignment sensor, a level sensor, a transmission image sensor, a lens interferometer, or any combination of the foregoing.

30. The method according to claim 28, wherein the portion of the measurement system comprises a reference mark provided on a substrate table.

* * * * *